(12) United States Patent
Shah et al.

(10) Patent No.: US 9,157,971 B2
(45) Date of Patent: Oct. 13, 2015

(54) DISTRIBUTED CAPACITANCE RADIO FREQUNCY (RF) COIL AND MAGNETIC RESONANCE IMAGING SYSTEM INCLUDING THE SAME

(75) Inventors: Bijay Shah, Brookfield, WI (US); Ricardo Becerra, Waukesha, WI (US); Masahiro Fujimoto, Waukesha, WI (US); Zhentian Xie, Waukesha, WI (US); Michael P. Edwards, Dousman, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/344,317

(22) Filed: Jan. 5, 2012

(65) Prior Publication Data

US 2013/0335086 A1 Dec. 19, 2013

(51) Int. Cl.
*G01R 33/34* (2006.01)

(52) U.S. Cl.
CPC .... *G01R 33/34076* (2013.01); *G01R 33/34007* (2013.01)

(58) Field of Classification Search
CPC ............... G01R 33/34046; G01R 33/34076; G01R 33/3628; G01R 33/343; G01R 33/34007; G01R 33/341; G01R 33/3453; G01R 33/3415; G01R 33/34; G01R 33/422; G01R 33/34023; H01L 21/31; G01V 3/00
USPC .............. 324/318–322, 307, 200; 29/606
See application file for complete search history.

(56) References Cited

U.S. PATENT DOCUMENTS

| | | | |
|---|---|---|---|
| 4,885,539 A * | 12/1989 | Roemer et al. ................ 324/318 |
| 6,232,779 B1 * | 5/2001 | Tropp et al. .................... 324/322 |
| 6,377,047 B1 * | 4/2002 | Wong et al. .................... 324/318 |
| 6,667,674 B2 * | 12/2003 | de Swiet et al. .............. 333/219 |
| 6,751,847 B1 * | 6/2004 | Brey et al. ........................ 29/606 |
| 7,015,695 B2 * | 3/2006 | Tropp et al. .................... 324/318 |
| 7,088,104 B2 * | 8/2006 | Bottomley .................... 324/328 |
| 2009/0009169 A1 * | 1/2009 | Schulz ........................... 324/318 |
| 2009/0206840 A1 * | 8/2009 | Overweg et al. ............. 324/322 |
| 2012/0149213 A1 * | 6/2012 | Nittala et al. ................. 438/783 |

FOREIGN PATENT DOCUMENTS

WO WO2005/124379 12/2005

* cited by examiner

*Primary Examiner* — Paresh Patel
*Assistant Examiner* — Neel Shah
(74) *Attorney, Agent, or Firm* — Dean D. Small; The Small Patent Law Group, LLC.

(57) ABSTRACT

A radio frequency (RF) birdcage coil includes a first distributed capacitance end ring, a second distributed capacitance end ring, and a plurality of rungs connected between the first and second end rings, wherein at least one of the first and second distributed capacitance end rings includes a substrate having a first side and a second side, a first plurality of conductors formed on the first side, a second plurality of conductors formed on the second side, and an insulating material deposited on the first side such that the insulating material substantially covers the first plurality of conductors.

21 Claims, 4 Drawing Sheets

DISTRIBUTED CAPACITANCE RADIO FREQUNCY (RF) COIL AND MAGNETIC RESONANCE IMAGING SYSTEM INCLUDING THE SAME

BACKGROUND OF THE INVENTION

The subject matter disclosed herein relates generally to magnetic resonance imaging (MRI) systems, and more particularly to a distributed capacitance radio frequency (RF) coil for MRI systems.

MRI is a medical imaging modality that generates images of the inside of a human body without using x-rays or other ionizing radiation. MRI uses a magnet to create a strong, uniform, static magnetic field (i.e., the "main magnetic field") and gradient coils to produce smaller amplitude, spatially varying magnetic fields when a current is applied to the gradient coils. When a human body, or part of a human body, is placed in the main magnetic field, the nuclear spins that are associated with hydrogen nuclei in tissue water become polarized. The magnetic moments that are associated with these spins become preferentially aligned along the direction of the main magnetic field, resulting in a small net tissue magnetization along that axis (the "z axis," by convention) and the gradient coils encode the MR signal.

RF coils are used to create pulses of RF energy at or near the resonance frequency of the hydrogen nuclei, also referred to herein as the Larmor frequency. These RF coils are used to transmit RF excitation signals and receive MR signals used to form the images. Various types of RF coils may be used in an MRI system such as a whole-body RF coils and RF surface (or local) coils. Two common RF coil configurations are the birdcage coil and the transverse electromagnetic (TEM) coil. The birdcage coil typically includes a pair of end rings and a plurality of rungs coupled between the pair of end rings. In order to reduce a volume of the birdcage coil, a portion of the end rings and/or rungs, of at least one known birdcage coil, are fabricated from a thin copper foil.

Under various operational conditions, the known birdcage coil may be subjected to relatively high power, for example, 7 Tesla (T). When operating at the relatively high power, air between gaps of the rungs and/or end rings may ionize. More specifically, when the voltage on the known RF coil is increased to a sufficient level the air is converted from an insulator to a conductor, also referred to herein as the breakdown voltage. Thus, when the RF coil reaches the breakdown voltage, ionization of the air in the gaps may result in arcing to occur between various portions of the birdcage coil which may result in an eventual failure of the RF coil.

BRIEF DESCRIPTION OF THE INVENTION

In one embodiment, a radio frequency (RF) birdcage coil is provided. The RF birdcage coil includes a first distributed capacitance end ring, a second distributed capacitance end ring, and a plurality of rungs connected between the first and second end rings. At least one of the first and second distributed capacitance end rings includes a substrate having a first side and a second side, a first plurality of conductors formed on the first side, a second plurality of conductors formed on the second side, and an insulating material deposited on the first side such that the insulating material substantially covers the first plurality of conductors.

In another embodiment, another radio frequency (RF) birdcage coil is provided. The RF birdcage coil includes a first end ring, a second end ring, and a plurality of distributed capacitance rungs connected between the first and second end rings, wherein at least one of the distributed capacitance rungs includes a substrate having a first side and a second side, a first plurality of conductors formed on the first side, a second plurality of conductors formed on the second side, and an insulating material deposited on the first side such that the insulating material substantially covers the first plurality of conductors.

In another embodiment, another radio frequency (RF) birdcage coil is provided. The RF birdcage coil includes a first distributed capacitance end ring, a second distributed capacitance end ring, and a plurality of rungs connected between the first and second end rings. At least one of the first and second distributed capacitance end rings includes a first substrate having a first side and a second side, a first plurality of conductors formed on the first side, and a second plurality of conductors formed on the second side, and a second substrate having a first side, a second side, and a third plurality of conductors formed on the first side, the second substrate second side being coupled to the first substrate first side.

In a further embodiment, a method of fabricating a radio frequency (RF) birdcage coil is provided. The method includes depositing a first metallic layer onto a first side of a first substrate, etching the first metallic layer to form a first plurality of conductors, depositing a second metallic layer onto a second side of a first substrate, etching the second metallic layer to form a second plurality of conductors, and depositing a first insulating layer onto the first side of the first substrate.

DETAILED DESCRIPTION OF THE INVENTION

Figure 1:
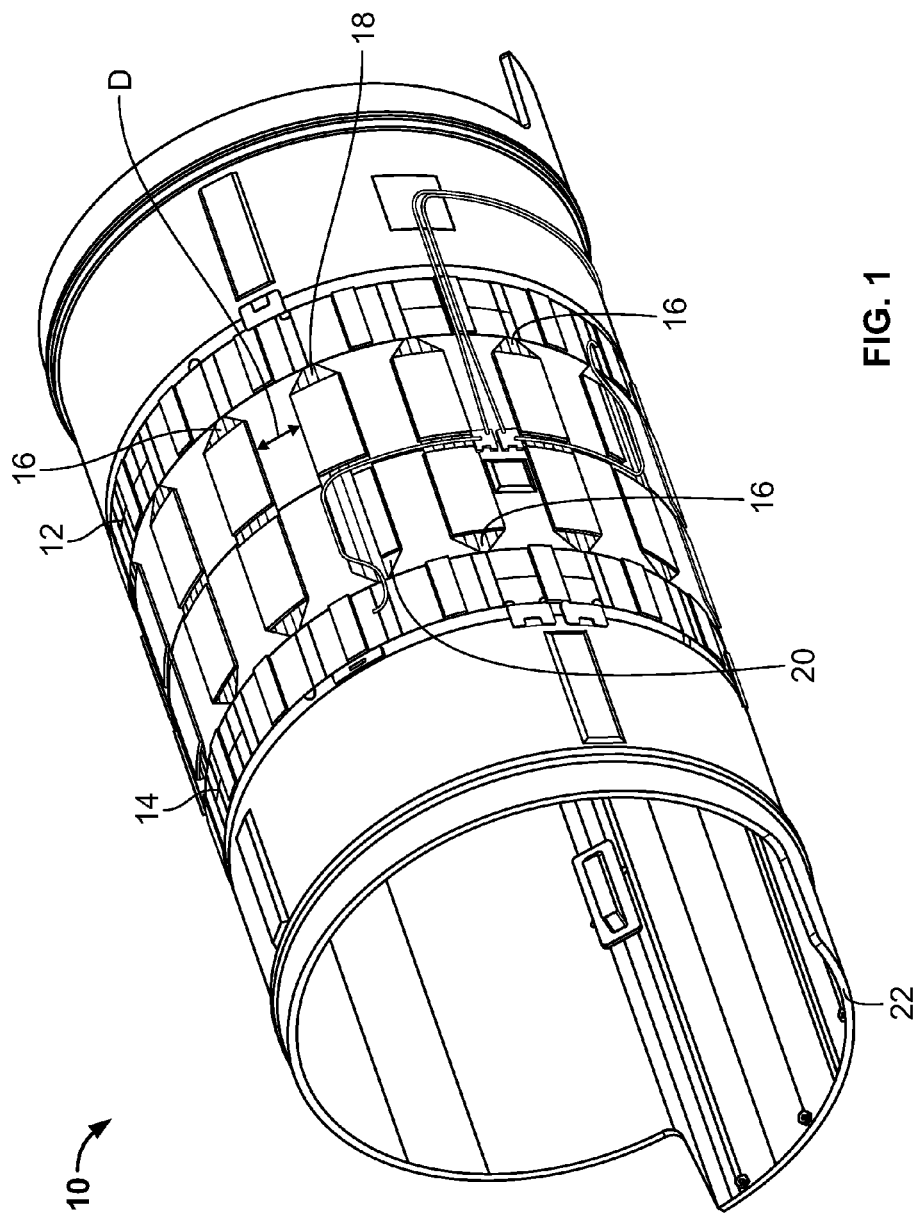
FIG. 1 is a perspective view of a radio frequency (RF) birdcage coil formed in accordance with various embodiments.

Embodiments of the invention will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide a radio frequency (RF) birdcage coil having an increased voltage breakdown capacity and a method for fabricating an RF birdcage coil. The RF birdcage coil may be embodied, for example, as a RF birdcage coil or a transverse electromagnetic (TEM) coil. The RF birdcage coil generally includes a pair of end rings and a plurality of rungs that are connected between the pair of end rings. In various embodiments, the RF birdcage coil is a distributed capacitance RF birdcage coil and includes a coating that is configured to increase the voltage breakdown threshold of the RF birdcage coil. The RF birdcage coil, having an increased voltage breakdown threshold, may be utilized with imaging systems having a greater power capability.

FIG. 1 is a perspective view of an exemplary RF coil 10. In the exemplary embodiment, the RF coil 10 is a RF birdcage coil that includes a first end ring 12, a second end ring 14 and a plurality of rungs 16 that are electrically coupled between the first and second end rings 12 and 14, respectively. Each of the plurality of rungs 16 includes a first end 18 and a second opposite end 20. In the exemplary embodiment, the first end 18 of each rung 16 is electrically coupled to the first end ring 12 and the second end 20 of each rung 16 is electrically coupled to the second end ring 14. The rungs 16 may be coupled to each of the end rings 12 and 14 using, for example, a soldering procedure. In other embodiments, the rungs 16 may be coupled to each of the end rings 12 and 14 using, for example, an electrically conductive adhesive. In the exemplary embodiment, the end rings 12 and 14 and the rungs 16 are mounted on a coil former 22 to form the RF coil 10.

As shown in FIG. 1, the first end ring 12 and the second end ring 14 oppose one another in a spaced-apart relationship and are connected by the plurality of rungs 16 such that the RF coil 10 is substantially cylindrical in shape with annular ends. The rungs 16 are arranged circumferentially around the end rings 12 and 14 and are, in the exemplary embodiment, uniformly spaced apart from one another. It should be realized that the RF coil 10 may have fewer or more rungs 16 than the illustrated embodiment. The quantity of rungs 16 may be selected based on the requirements of a particular imaging application. For example, the quantity of rungs 16 may be selected based on a desired field-of-view (FOV), a desired image resolution, a desired power requirement and/or a desired imaging speed. More specifically, the RF coil 10 includes N rungs 16 which are radially separated from each other by a distance D. In various embodiments, N may be 8, 16, 24, or 32, for example. In the exemplary embodiment, N=16.

In various embodiments, the exemplary embodiment, each rung 16 includes a plurality of capacitors (not shown). The capacitors may be, for example, low inductance end ring capacitors that electrically connect the rungs 16 together. The rungs 16 may be constructed from a material having high electrical conductivity, such as, for example, copper.

The RF coil 10 shown in FIG. 1 may be used as a whole-body RF coil or as a surface (or local) coil. For a whole-body RF coil, the dimensions of the RF coil 10 are configured so that the RF coil 10 may be installed inside a superconducting magnet assembly or inside the bore of an imaging system such as the imaging system shown in FIG. 7. The dimensions of RF coil 10 are configured so that the RF coil 10 may be disposed within a bore 446, also shown in FIG. 7.

Figure 2:
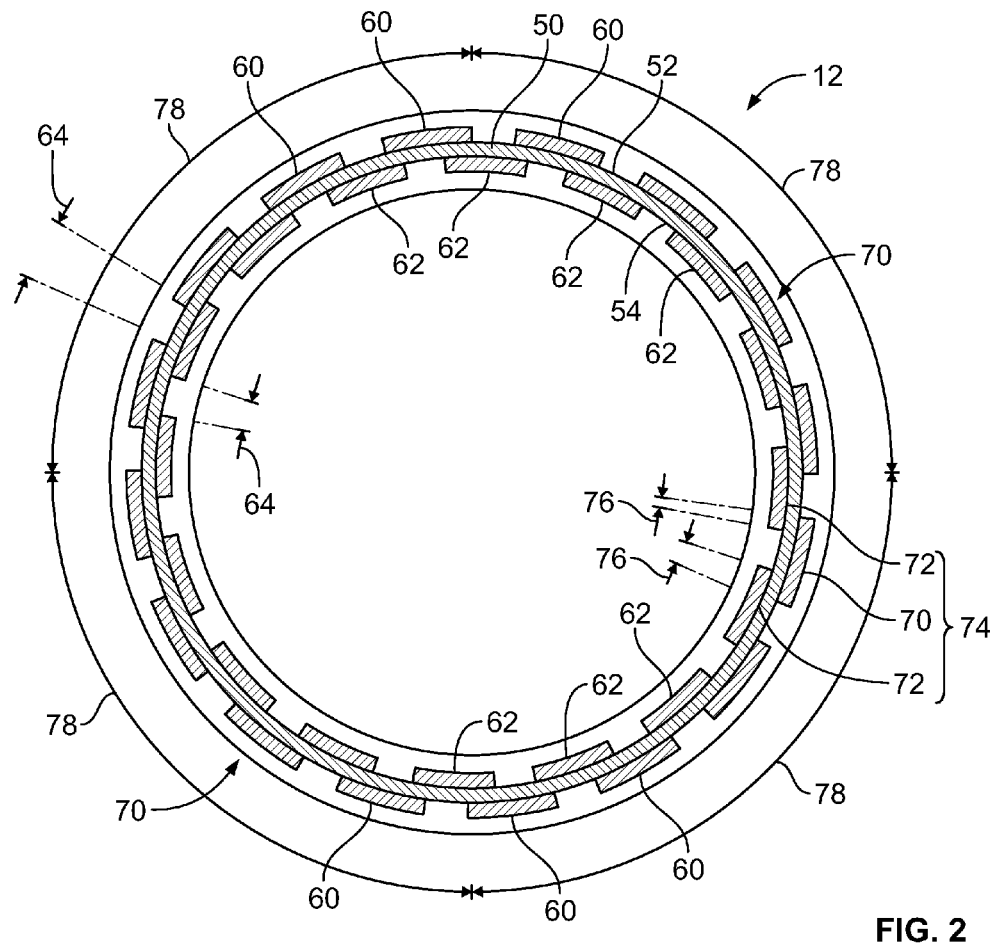
FIG. 2 is an end view of an end ring that may be formed in accordance with various embodiments.

FIG. 2 is an end view of the RF coil 10 shown in FIG. 1. More specifically, FIG. 2 is an end view of the end ring 12 shown in FIG. 1. Although various embodiments are described with respect to the end ring 12, it should be realized that the end ring 14 may be substantially similar to the end ring 12. The end ring 12 includes a substrate 50 having a first side 52 and a second opposite side 54. In various embodiments, the substrate 50 may be fabricated from an insulating material, such as for example, FR4. FR4 is dielectric material that may be, for example, a fiberglass reinforced epoxy laminate that is flame retardant (FR) and self-extinguishing. It should be realized that although the substrate 50 is described in various embodiments as being fabricated using FR4, the substrate 50 may be fabricated using any suitable dielectric material.

The end ring 12 includes a first plurality of conductors 60 that are disposed on the first side 52 of the end ring 12. The end ring 12 also includes a second plurality of conductors 62 that are disposed on the second side 54 of the end ring 12. In various embodiments, the conductors 60 are each separated by a gap 64 and the conductors 62 are also each separated by the gap 64. In various embodiments, each of the conductors 60 and 62 are the same size to enable the conductors 60 and 62 to be arranged in a substantially symmetrical arrangement around the end ring 12.

As shown in FIG. 2, the conductors 60 are shifted with respect to the conductors 62 such each conductor 60 overlays at least a portion of two adjacent conductors 62 to form a single capacitor 74. More specifically, the combination of a single conductor 70 at least partially overlapping a pair of conductors 72 forms the single capacitor 74. Moreover, an overlap 76 between the conductor 70 and the pair of conductors 72 determines the capacitance of the capacitor 74. Accordingly, the overlap 76 is predetermined or defined based on the amount of capacitance, also referred to herein as the embedded capacitance, desired to be achieved by the capacitor 74. Accordingly, because the first side 52 includes a plurality of conductors 60 and the second side 54 includes a plurality of conductors 62, wherein each conductor 60 overlaps a portion of two conductors 62, the conductors 60 and the conductors 62 form a distributed capacitance end ring 12. In operation, the capacitance generated by the conductors 60 and the conductors 62 is distributed around the end ring 12 having a selected capacitance per unit along the length of the end ring 12.

In various embodiments, the end ring 12 may include thirty-two conductors 60 and thirty-two conductors 62 that are radially shifted with respect to the conductors 60. Thus, the combination of the thirty-two conductors 60 and the thirty-two conductors 62 generate a distributed capacitance around the end ring 12. In other embodiments, the end ring 12 may include more than thirty-two conductors 60 and 62 or fewer than thirty-two conductors 60 and 62 based upon the desired distributed capacitance to be generated by the end ring 12. For example, in one embodiment, the RF coil 10 includes sixteen rungs 16. Accordingly, in one embodiment, the RF coil 10 may also include sixteen conductors 60 and sixteen conductors 62 forming sixteen capacitors 74 that are arranged radially around the end ring 12.

In various embodiments, the end ring 12, and thus the capacitors 74, may be formed using a plurality of end ring segments. For example, as shown in FIG. 2, the end ring 12 may be fabricated to include four end-ring segments 78 wherein each end ring segment 78 spans approximately 90 degrees. Optionally, the end ring 12 may be fabricated using fewer than four end ring segments 78. For example, the end ring 12 may be fabricated using two end ring segments 78 that each span approximately 180 degrees. In various other embodiments, the end ring 12 may be fabricated using eight end ring segments 78 that each span approximately 45 degrees.

In the exemplary embodiment, as described above, the conductors 60 are space approximately equidistantly around the first side 52 and the conductors 62 are spaced approximately equidistantly around the second side 54. Moreover, the first conductors 60 are radially shifted with respect to the second conductors 62. For example, assuming that in various embodiments, the end ring 12 includes sixteen conductors 60, the conductors 60 would be spaced approximately every 22.5 degrees. Moreover, assuming the end ring 12 also includes sixteen conductors 62, the conductors 62 are spaced approximately every 22.5 degrees. Moreover, in various embodiments, the conductors 60 are shifted in radial position from the conductors 62 by approximately 11.25 degrees such that each conductor 60 partially overlaps two conductors 62.

The quantity of conductors 60 and 62 installed on the end rings 12 and 14, respectively, in various embodiments, is based on a desired distributed capacitance to be generated by the RF coil 10. More specifically, changing the quantity of conductors 60 and 62 may change a capacitance of the end rings 12 and 14.

The RF coil 10 may include N rungs and N capacitors 74 mounted to each end ring 12 and 14, respectively. For example, in one embodiment, the RF coil 10 includes sixteen rungs 16. Accordingly, the RF coil 10 may include 16 capacitors 74 coupled to the first end ring 12 and equidistantly spaced around the first end ring 12. Moreover, the RF coil 10 may include 16 capacitors 74 coupled to the second end ring 14 and equidistantly spaced around the first end ring 12.

Figure 3:
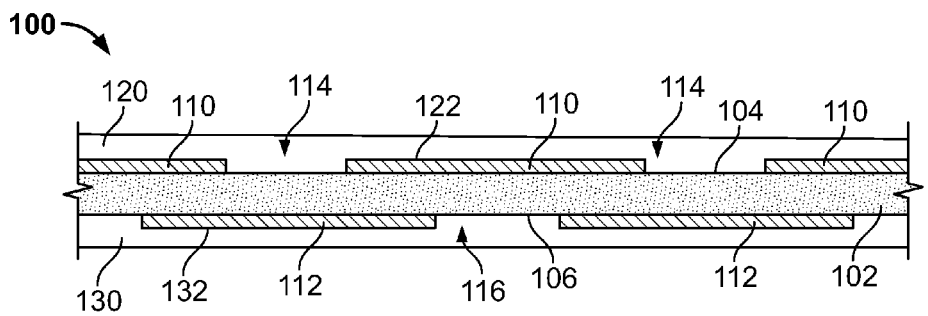
FIG. 3 is an end view of an end ring or rung segment that may form a portion of the end ring shown in FIG. 2 in accordance with various embodiments.

FIG. 3 is an end view of an exemplary segment 100 that may be used to form a portion of the RF coil described above. In various embodiments, the segment 100 may be an end ring segment. In various other embodiments, the segment may be a rung segment. Accordingly, although the exemplary embodiment described below is described with respect to the segment 100 being an end ring segment 100. It should be realized that the segment 100 may also form a rung. In the exemplary embodiment, the end ring segment 100 that may be utilized to form the end rings 12 and 14 described above. In various embodiments, a plurality of end ring segments 100 may be coupled together to form the end rings 12 and 14. The segment 100 includes a substrate 102 having a first side 104 and a second side 106. The substrate 102 may be fabricated from a dielectric material, such as for example, FR4. The segment 100 also includes a plurality of conductors 110 formed on the first side 104 and a plurality of conductors 112 that are formed on the second side 106. The conductors 110 are each separated from an adjacent conductor 110 by a gap 114. Moreover, the conductors 112 are each separated from an adjacent conductor 112 by a gap 116.

As illustrated, the conductors 110 may be staggered with respect to the conductors 112 to form a distributed capacitance end ring as described above. The end ring segment 100 also includes an insulating layer 120. In one embodiment, the insulating layer 120 is an electrical insulating material such as a dielectric material that substantially inhibits electrical charges from flowing there through. In one embodiment, the insulating layer 120 is disposed on the first side 104 such that the insulating layer 120 overlays the conductors 110 and the plurality of gaps 114 that are formed between the conductors 110.

In operation, the insulating layer 120 is configured to increase the voltage breakdown capability of the segment 100. More specifically, when operating at relatively high powers, e.g. 3 T to 7 T, any air entrained in the gaps 114 may be ionized which may result in arcing between at least one conductor 110 and at least one conductor 112 or between two conductors 110 or between two conductors 112. Accordingly, the insulating layer 120 is overlaid onto the segment 100 such that the insulating layer 120 substantially fills the gaps 114 located between each adjacent conductor 110. Thus, in various embodiments, the insulating layer 120 facilitates eliminating any air gaps that may be located between the conductors 110 and reduces the likelihood of unintentional arcing occurring between the conductors 110 and the conductors 112, and increases the voltage handling capability of the end rings 12 and 14. Moreover, the insulating layer 120 is also overlaid onto the segment 100 such that the insulating layer 120 substantially covers the conductors 110. Accordingly, the insulating layer 120 may be formed on the first side 104 such that the insulating layer 120 substantially covers both the exposed portions of the substrate 102, formed by the gaps 114 and also covers an upper surface 122 of each of the conductors 110.

The segment 100 may also include a second insulating layer 130. The second insulating layer 130 is an electrical insulator such as a dielectric material that substantially inhibits electrical charges from flowing there through. In one embodiment, the second insulating layer 130 is disposed on the second side 106 such that the second insulating layer 130 overlays the conductors 112 and the plurality of gaps 116 that are formed between the conductors 112.

In operation, the insulating layer 130 is configured to further increase the voltage breakdown capability of the segment 100. More specifically, any air entrained in the gaps 114 may be ionized which may result in arcing between at least one conductor 110 and at least one conductor 112. Accordingly, the insulating layer 130 is overlaid onto the segment 100 such that the insulating layer 130 substantially fills the gaps 116 located between each adjacent conductor 112. Thus, the insulating layer 130 facilitates eliminating any air gaps that may be located between the conductors 112 and reduces the likelihood of unintentional arcing occurring between the conductors 110 and the conductors 112, and increases the voltage handling capability of the end rings 12 and 14. Moreover, the insulating layer 130 is also overlaid onto the segment 100 such that the insulating layer 130 substantially covers the conductors 112. Accordingly, in the exemplary embodiment, the insulating layer 130 is formed on the second side 106 such that the insulating layer 130 substantially covers both the exposed portions of the substrate 102, formed by the gaps 116 and also covers an upper surface 132 of each of the conductors 112.

Figure 4:
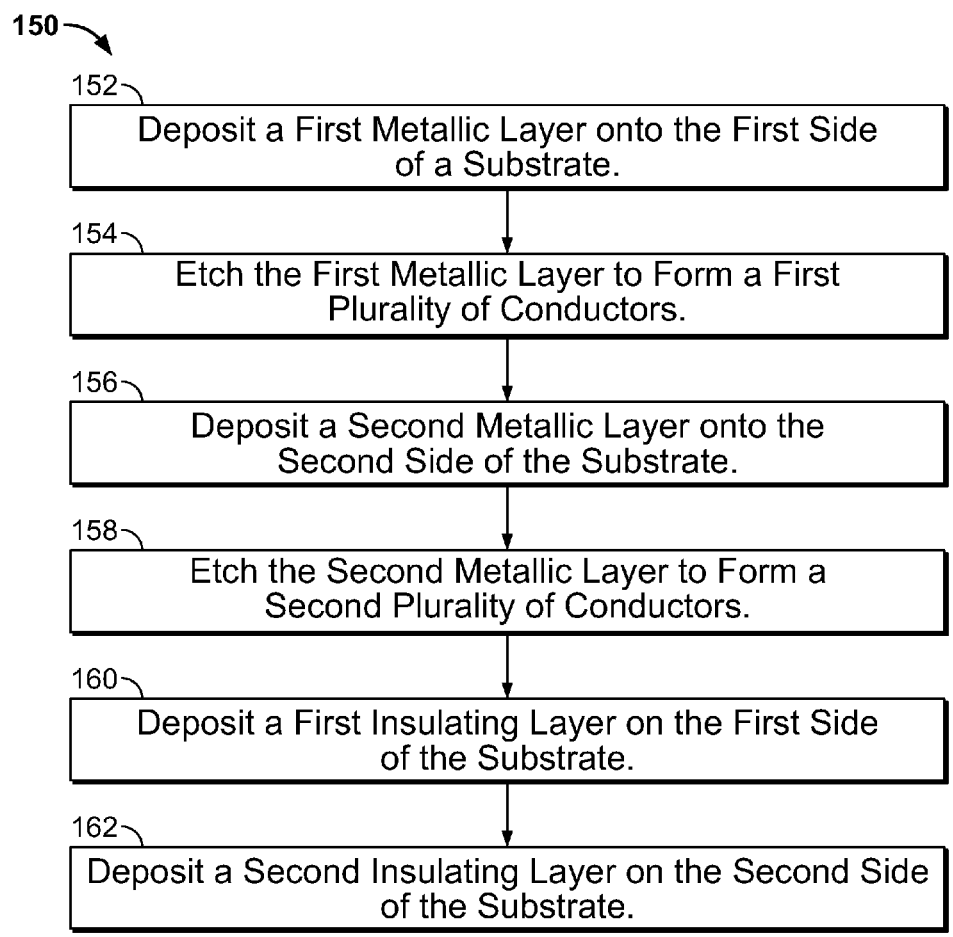
FIG. 4 is a flowchart of a method of fabricating an exemplary end ring or rung in accordance with various embodiments.

FIG. 4 is a flowchart of an exemplary method 150 of fabricating an RF coil that includes the segment 100 shown in FIG. 3. At 152, a first metallic layer is deposited on the first side 104 of the substrate 102. The first metallic layer may be formed from any electrically conductive material. In various embodiments, the first metallic layer is fabricated using a copper material. At 154, the first metallic layer is etched to form the conductors 110. For example, the etching may be performed using a photolithography process, etc. At 156, a second metallic layer is deposited on the second side 106 of the substrate 102. The second metallic layer may be formed from any electrically conductive material. In various embodiments, the second metallic layer is also fabricated using a copper material. At 158, the second metallic layer is etched to form the conductors 112. For example, the etching may be performed using a photolithography process, etc.

At 160, the insulating layer 120 is deposited onto the first side 102. More specifically, the insulating layer 120 is deposited on the first side 102 such that the insulating layer 120 substantially fills the exposed portions of substrate 102, e.g. the gaps 114 between the conductors 110, and also substantially covers the conductors 110. At 162, the insulating layer 130 is deposited onto the second side 106. More specifically, the insulating layer 130 is deposited on the second side 106 such that the insulating layer 130 substantially fills the exposed portions of substrate 102, e.g. the gaps 116 between the conductors 112, and also substantially covers the conductors 112.

Figure 5:
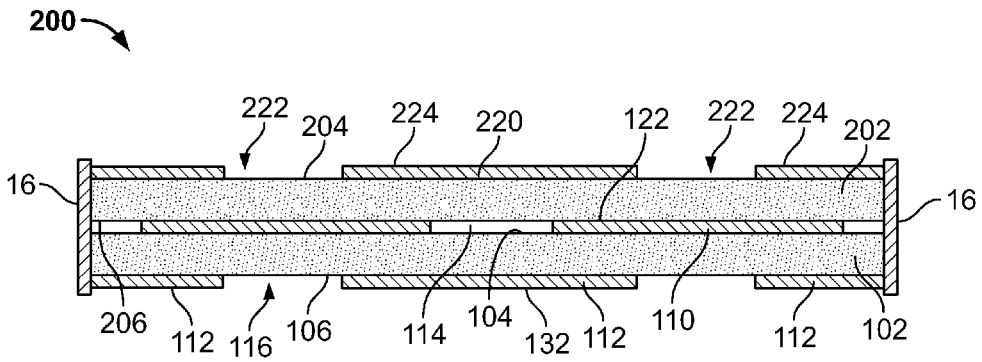
FIG. 5 is an end view of another end ring or rung segment that may form a portion of the end ring shown in FIG. 2 in accordance with various embodiments.

FIG. 5 is an end view of another exemplary end ring segment 200 that may form a portion of the end ring 12 shown in FIG. 2 or rungs in accordance with various embodiments. A plurality of end ring segments 200 may be coupled together to form the end rings 12 and 14. The segment 200 includes the substrate 102 having the first side 104 and the second side 106. The segment 200 also includes the plurality of conductors 110 formed on the first side 104 and the plurality of conductors 112 that are formed on the second side 106. The conductors 110 are each separated from an adjacent conductor 110 by the gap 114. Moreover, the conductors 112 are each separated from an adjacent conductor 112 by the gap 116. In various embodiments, the conductors 110 are staggered with respect to the conductors 112 to form a distributed capacitance end ring as described above.

The end ring segment 200 also includes a second substrate 202 that is deposited on the conductors 110. More specifically, the second substrate 202 has a first side 204 and an opposite second side 206. In various embodiments, the substrate 202 is fabricated from a dielectric material, such as for example, FR4. The substrate 202 may be coupled to the first side 104 of the substrate 102, e.g. the conductors 110, using for example, an adhesive. The segment 200 also includes a plurality of electrical conductors 220 that are deposited on the first side 204. The conductors 220 are each separated from an adjacent conductor 220 by a gap 222. In various embodiments, the conductors 220 are staggered with respect to the conductors 110 and are substantially aligned with the conductors 112.

The end ring segment 200 further includes a conductor 221 that is configured to couple at least one of the conductors 220 to at least one of the conductors 112. The end ring segment 200 further includes a conductor 223 that is configured to couple at least one of the conductors 220 to at least one of the conductors 112. Accordingly, the conductors 221 and 223 facilitate electrically coupling the conductors on the first side to the conductors on the opposite side.

In operation, the substrate 202 is configured to further increase the voltage breakdown capability of the segment 200. More specifically, the substrate 202 is overlaid onto the conductors 110 such that the substrate 202 substantially seals the gaps 114 located between each adjacent conductor 110. Optionally, the gaps 114 may be filled with the substrate 202. Thus, the substrate 202 facilitates eliminating any air gaps that may be located between the conductors 110 and reduces the likelihood of unintentional arcing occurring between the conductors 110 and the conductors 112, and increases the voltage handling capability of the end rings 12 and 14. Accordingly, in the exemplary embodiment, the substrate 202 is overlaid on the first side 104 such that the substrate 202 substantially covers both the exposed portions of the substrate 102, formed by the gaps 114 and also covers an upper surface 122 of each of the conductors 110.

In various embodiments, the segment 200 may also include an insulating layer, such as the insulating layer 120 shown in FIG. 3. In the exemplary embodiment, the insulating layer 120 may be deposited on the first side 204 of the second substrate 202 such that the insulating layer 120 overlays the conductors 220 and the plurality of gaps 222 that are formed between the conductors 220.

In operation, the insulating layer 120 is configured to increase the voltage breakdown capability of the segment 100. More specifically, the insulating layer 120 is overlaid onto the segment 200 such that the insulating layer 120 substantially fills the gaps 222 located between each adjacent conductor 220. Thus, the insulating layer 120 facilitates eliminating any air gaps that may be located between the conductors 220 and reduces the likelihood of unintentional arcing occurring between the conductors 220 and the conductors 110, and increases the voltage handling capability of the end rings 12 and 14. Moreover, the insulating layer 120 is also overlaid onto the segment 200 such that the insulating layer 120 substantially covers the conductors 220. Accordingly, in the exemplary embodiment, the insulating layer 120 is formed on the first side 204, of the substrate 202, such that the insulating layer 120 substantially covers both the exposed portions of the substrate 202, formed by the gaps 222 and also covers an upper surface 224 of each of the conductors 220.

In various other embodiments, the segment 200 may also include the second insulating layer 130 (shown in FIG. 3). In one embodiment, the second insulating layer 130 is disposed on the second side 106, of the first substrate 102, such that the insulating layer 130 overlays the conductors 112 and the plurality of gaps 116 that are formed between the conductors 112.

In operation, the insulating layer 130 is configured to further increase the voltage breakdown capability of the segment 200. More specifically, the insulating layer 130 is overlaid onto the segment 100 such that the insulating layer 130 substantially fills the gaps 116 located between each adjacent conductor 112. Thus, the insulating layer 130 facilitates eliminating any air gaps that may be located between the conductors 112 and reduces the likelihood of unintentional arcing occurring between the conductors 110 and the conductors 112, and increases the voltage handling capability of the end rings 12 and 14. Moreover, the insulating layer 130 is also overlaid onto the segment 100 such that the insulating layer 130 substantially covers the conductors 112. Accordingly, in the exemplary embodiment, the insulating layer 130 is formed on the second side 106 such that the insulating layer 130 substantially covers both the exposed portions of the substrate 102, formed by the gaps 116 and also covers an exposed surface 132 of each of the conductors 112.

Figure 6:
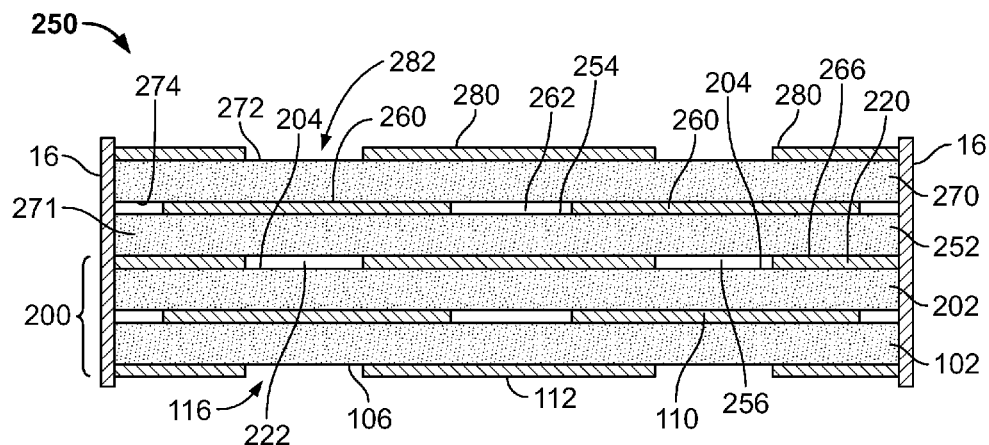
FIG. 6 is an end view of another end ring or rung segment that may form a portion of the end ring shown in FIG. 2 in accordance with various embodiments.

FIG. 6 is an end view of another exemplary end ring segment 250 that may form a portion of the end ring 12 shown in FIG. 2. In various embodiments, a plurality of end ring segments 250 may be coupled together to form the end rings 12 and 14. The segment 250 includes the segment 200 described in FIG. 5.

The end ring segment 250 also includes a third substrate 252 that is deposited on the conductors 220. More specifically, the third substrate 252 has a first side 254 and an opposite second side 256. In various embodiments, the substrate 252 is fabricated from a dielectric material, such as for example, FR4. The substrate 252 may be coupled to the first side 204 of the second substrate 202, e.g. the conductors 220, using for example, an adhesive. The segment 250 also includes a plurality of electrical conductors 260 that are deposited on the first side 254 of the third substrate 252. The conductors 260 are each separated from an adjacent conductor 260 by a gap 262. In various embodiments, the conductors 260 are staggered with respect to the conductors 220 and are substantially aligned with the conductors 110. The end ring segment 250 further includes a conductor 271 and a conductor 273. In operation, the conductors 271 and 273 facilitate electrically coupling the first layer, the third layer, and the fifth layer of the end ring segment 250.

In operation, the substrate 252 is configured to further increase the voltage breakdown capability of the segment 250. More specifically, the substrate 252 is overlaid onto the conductors 220 such that the substrate 252 substantially seals the gaps 222 located between each adjacent conductor 220. Thus, the substrate 252 facilitates eliminating any air gaps that may be located between the conductors 220 and reduces the likelihood of unintentional arcing occurring between the conductors 260 and the conductors 220, and increases the voltage handling capability of the end rings 12 and 14. Accordingly, in the exemplary embodiment, the substrate 252 is overlaid on the first side 204, of the second substrate 202 such that the substrate 252 substantially covers both the exposed portions of the substrate 202, formed by the gaps 222 and also covers an upper surface 266 of each of the conductors 220.

The segment 250 may also include a fourth substrate 270 that is deposited on the conductors 260. More specifically, the fourth substrate 270 has a first side 272 and an opposite second side 274. In various embodiments, the substrate 270 is fabricated from a dielectric material, such as for example, FR4. The substrate 270 may be coupled to the first side 254 of the third substrate 252, such as the conductors 260, using for example, an adhesive. The segment 250 also includes a plurality of electrical conductors 280 that are deposited on the first side 272 of the fourth substrate 270. The conductors 280 are each separated from an adjacent conductor 280 by a gap 282. In various embodiments, the conductors 280 are staggered with respect to the conductors 260 and are substantially aligned with the conductors 220.

In operation, the substrate 270 is configured to further increase the voltage breakdown capability of the segment 250. More specifically, the substrate 270 is overlaid onto the conductors 260 such that the substrate 270 substantially seals the gaps 262 located between each adjacent conductor 260. Thus, the substrate 270 facilitates eliminating any air gaps that may be located between the conductors 260 and reduces the likelihood of unintentional arcing occurring between the conductors 280 and the conductors 260, and increases the voltage handling capability of the end rings 12 and 14.

The segment 250 may also include an insulating layer, such as the insulating layer 120 shown in FIG. 3. In the exemplary embodiment, the insulating layer 120 is deposited on the first side 272 of the fourth substrate 270 such that the insulating layer 120 overlays the conductors 280 and the plurality of gaps 282 that are formed between the conductors 280.

The segment 250 may also include the second insulating layer 130 (shown in FIG. 3). In one embodiment, the second insulating layer 130 is disposed on the second side 106, of the first substrate 102, such that the insulating layer 130 overlays the conductors 112 and the plurality of gaps 116 that are formed between the conductors 112.

Various embodiments described herein provide a method and system for increasing a voltage breakdown of a distributed capacitance RF birdcage coil. The distributed capacitance is generated by fabricating the RF birdcage coil to include two parallel conductive plates with a dielectric material dispose there between. In operation, the additional layers of dielectric material disposed over the top and bottom conductive layers can increase the voltage handling capability of the birdcage structure. Moreover, the distributed capacitance RF coil may include a single layer or multiple layers of dielectric capacitors.

Figure 7:
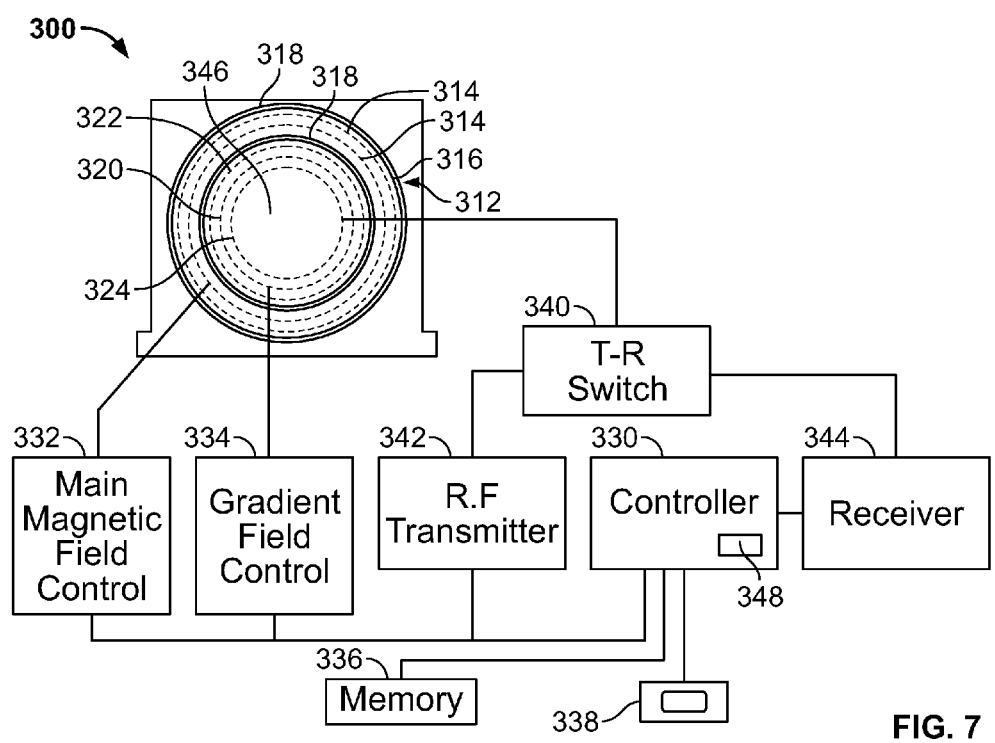
FIG. 7 is a block diagram of a magnetic resonance imaging (MRI) system formed in accordance with various embodiments.

Various embodiments of the RF coil 10 and methods described herein may be provided as part of, or used with, a medical imaging system, such as an imaging system 300 as shown in FIG. 7. It should be appreciated that although the imaging system 300 is illustrated as a single modality imaging system, the various embodiments may be implemented in or with multi-modality imaging systems. For example, the imaging system 300 is illustrated as an MRI system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

In the exemplary embodiment, the imaging system 300 includes a superconducting magnet assembly 312 that includes a superconducting magnet 314. The superconducting magnet 314 is formed from a plurality of magnetic coils supported on a magnet coil support or coil former. In one embodiment, the superconducting magnet assembly 312 may also include a thermal shield 316. A vessel 318 (also referred to as a cryostat) surrounds the superconducting magnet 314, and the thermal shield 316 surrounds the vessel 318. The vessel 318 is typically filled with liquid helium to cool the coils of the superconducting magnet 314. A thermal insulation (not shown) may be provided surrounding the outer surface of the vessel 318. The imaging system 300 also includes a main gradient coil 320, a shield gradient coil 322, and an RF transmit coil 324. The RF transmit coil 324 may be, for example, the RF coil 10 described above. The imaging system 300 also generally includes a controller 330, a main magnetic field control 332, a gradient field control 334, a memory 336, a display device 338, a transmit-receive (T-R) switch 340, an RF transmitter 342 and a receiver 344.

In operation, a body of an object, such as a patient (not shown), or a phantom to be imaged, is placed in the bore 346 on a suitable support, for example, a motorized table (not shown) or other patient table. The superconducting magnet 314 produces a uniform and static main magnetic field $B_1$ across the bore 346. The strength of the electromagnetic field in the bore 346 and correspondingly in the patient, is controlled by the controller 330 via the main magnetic field control 332, which also controls a supply of energizing current to the superconducting magnet 314.

The main gradient coil 320, which may include one or more gradient coil elements, is provided so that a magnetic gradient can be imposed on the magnetic field $B_1$ in the bore 346 in any one or more of three orthogonal directions x, y, and z. The main gradient coil 320 is energized by the gradient field control 334 and is also controlled by the controller 330.

The RF transmit coil 324, which may include a plurality of coils (e.g., resonant surface coils), is arranged to transmit magnetic pulses and/or optionally simultaneously detect MR signals from the patient, if receive coil elements are also provided. The RF transmit coil 324 and a receive surface coil, if provided, may be selectably interconnected to one of the RF transmitter 342 or receiver 344, respectively, by the T-R switch 340. The RF transmitter 342 and T-R switch 340 are controlled by the controller 330 such that RF field pulses or signals are generated by the RF transmitter 342 and selectively applied to the patient for excitation of magnetic resonance in the patient. Various embodiments may be used to form different coil configurations such as birdcage coils, transverse electromagnetic (TEM) coils, whole-body coils, and/or surface, or local, coils and for transmitting and/or receiving signals.

Following application of the RF pulses, the T-R switch 340 is again actuated to decouple the RF transmit coil 324 from the RF transmitter 342. The detected MR signals are in turn communicated to the controller 330. The controller 330 includes a processor 348 that controls the processing of the MR signals to produce signals representative of an image of the patient. The processed signals representative of the image are also transmitted to the display device 338 to provide a visual display of the image. Specifically, the MR signals fill or form a k-space that is Fourier transformed to obtain a viewable image which may be viewed on the display device 338.

In various embodiments, the RF coil 324 is configured to generate signals at one or more resonant frequencies, for example, centered about the Larmor frequencies of proton (hydrogen nuclei) and/or carbon (e.g., $^{13}C$ nuclei). However, it should be noted that the RF transmitter 342 may be configured to generate other frequencies causing different nuclei to resonate at their Larmor frequencies. Moreover, the MR signals and the image(s) generated may be encoded using any known technique in the art.

The various embodiments and/or components, for example, the modules, or components and controllers therein, such as of the imaging system 300, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" may include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A radio frequency (RF) birdcage coil comprising:
a first distributed capacitance end ring;
a second distributed capacitance end ring; and
a plurality of rungs connected between the first and second distributed capacitance end rings, wherein at least one of the first and second distributed capacitance end rings includes a substrate having a first side and a second side, a first plurality of conductors formed on the first side as outermost conductors, a second plurality of conductors formed on the second side, and an insulating layer deposited on the first side such that the insulating layer substantially covers an upper surface of the first plurality of conductors that faces away from the substrate in order that the first plurality of conductors are sandwiched between the insulating layer and the substrate in order to reduce a likelihood of unintentional arcing.

2. The RF birdcage coil of claim 1, further comprising a second insulating layer deposited on the second side and substantially covers the second plurality of conductors in order to reduce a likelihood of unintentional arcing.

3. The RF birdcage coil of claim 1, wherein the first plurality of conductors represent outermost electrodes and are each separated by a gap, the insulating layer both covering the upper surface and filling the gaps.

4. The RF birdcage coil of claim 1, wherein the first plurality of conductors are outermost and not overlaid by other conductors.

5. The RF birdcage coil of claim 1, further comprising a second insulating layer being deposited onto the second side to cover an upper surface of the second plurality of conductors that faces away from the substrate in order that the second plurality of conductors are sandwiched between the insulating layer and the substrate in order to reduce a likelihood of unintentional arcing.

6. The RF birdcage coil of claim 1, wherein the insulating layer comprises a dielectric material.

7. The RF birdcage coil of claim wherein the RF birdcage coil comprises body coil, a head coil or a transverse electromagnetic (TEM) coil.

8. The RF birdcage coil of claim 1, wherein the insulation layer is configured to inhibit electrical charge from flowing therethrough.

9. The RE birdcage coil of claim 1, wherein the insulation layer is configured to increase a breakdown voltage of at least one of the first and second plurality of conductors.

10. The RF birdcage coil of claim 1, wherein the insulation-layer fins gaps between adjacent conductors of the first plurality of conductors and eliminates air gaps between the adjacent conductors of the first plurality of conductors, the insulating layer includes a common insulating layer to fill the gaps and cover the upper layer.

11. The RF birdcage coil of claim 1, wherein an outer surface of the insulating layer is exposed to air.

12. The RF birdcage of claim 1 wherein the insulating layer includes a common material that fills gaps between the first plurality of conductors and that covers the upper surfaces of the first plurality of conductors.

13. A radio frequency (RF) birdcage coil comprising:
a first distributed capacitance end ring;
a second distributed capacitance end ring; and
a plurality of rungs connected between the first and second distributed capacitance end rings,
wherein at least one of the first and second distributed capacitance end rings comprises:
a first substrate having a first side and a second side, a first plurality of conductors formed on the first side, and a second plurality of conductors formed on the second side as outermost conductors, and
a second substrate having a first side, a second side, and a third plurality of conductors formed on the first side, the second substrate second side being coupled to the first substrate first side in order that the first plurality of conductors are sandwiched between the first and second substrates; and
an insulating layer deposited on the second substrate and substantially covering an upper surface of the second plurality of conductors that faces away from the second substrate in order that the second plurality of conductors are sandwiched between the insulating, layer and the second substrate in order to reduce a likelihood of unintentional arcing.

14. The RF birdcage coil of claim 13, further comprising a third substrate having a first side, a second side, and a fourth plurality of conductors formed on the first side, the third substrate being coupled to the second substrate first side.

15. The RF birdcage coil of claim 14, further comprising a fourth substrate having a first side, a second side, and a fifth plurality of conductors formed on the first side, the fourth substrate being coupled to the third substrate first side.

16. The RF birdcage coil of claim 15, wherein the first plurality of conductors are substantially parallel to the fifth plurality of conductors.

17. The RF birdcage coil of claim 15, further comprising a second insulating layer being deposited onto the fourth substrate first side and substantially covering an upper surface of the fifth plurality of conductors that faces away from the fourth substrate in order that the fifth plurality of conductors are sandwiched between the insulating layer and the fourth substrate in order to reduce a likelihood of unintentional arcing.

18. The RF birdcage coil of claim 13, wherein the first plurality of conductors are offset from the second plurality of conductors.

19. The RF birdcage coil of claim 13, wherein the first plurality of conductors are substantially parallel to the third plurality of conductors.

20. The RF birdcage coil of claim 13, wherein the first plurality of conductors are offset from the fourth plurality of conductors.

21. The RF birdcage of claim 13, wherein the insulating layer includes a common material that fills gaps between the first plurality of conductors and that covers the upper surfaces of the first plurality of conductors.

* * * * *